United States Patent
Liao et al.

(10) Patent No.: US 7,608,915 B2
(45) Date of Patent: Oct. 27, 2009

(54) HEAT DISSIPATION SEMICONDUCTOR PACKAGE

(75) Inventors: Chun-Ming Liao, Taichung Hsien (TW); Chien-Ping Huang, Taichung (TW); Ho-Yi Tsai, Taichung Hsien (TW); Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 12/151,902

(22) Filed: May 8, 2008

(65) Prior Publication Data
US 2008/0277777 A1  Nov. 13, 2008

(30) Foreign Application Priority Data
May 11, 2007  (TW) .............................. 96116758 A

(51) Int. Cl.
*H01L 23/495* (2006.01)
*H01J 23/10* (2006.01)
(52) U.S. Cl. ................... 257/675; 257/706; 257/707; 257/717; 257/796; 257/E33.075; 257/E23.051; 257/E23.081; 257/E23.101
(58) Field of Classification Search ............... 257/276, 257/625, 675, 706, 707, 712–722, 796, E33.075, 257/E31.131, E23.051, E23.08–E23.113; 438/122, FOR. 413
See application file for complete search history.

(56) References Cited
U.S. PATENT DOCUMENTS

| | | | |
|---|---|---|---|
| 5,672,548 A | 9/1997 | Culnane et al. | |
| 5,726,079 A * | 3/1998 | Johnson | 438/106 |
| 5,851,337 A | 12/1998 | Chen et al. | |
| 5,977,626 A | 11/1999 | Wang et al. | |
| 6,236,568 B1 | 5/2001 | Lai et al. | |
| 6,400,014 B1 | 6/2002 | Huang et al. | |
| 6,403,882 B1 | 6/2002 | Chen et al. | |
| 6,472,743 B2 | 10/2002 | Huang et al. | |
| 6,507,116 B1 | 1/2003 | Caletka et al. | |
| 6,552,428 B1 | 4/2003 | Huang et al. | |
| 6,744,132 B2 | 6/2004 | Alcoe et al. | |
| 7,126,218 B1 * | 10/2006 | Darveaux et al. | 257/706 |
| 2004/0036172 A1 * | 2/2004 | Azuma et al. | 257/738 |
| 2004/0212080 A1 * | 10/2004 | Chen et al. | 257/712 |

* cited by examiner

*Primary Examiner*—Jasmine J Clark
(74) *Attorney, Agent, or Firm*—Peter F. Corless; Steven M. Jensen; Edwards Angell Palmer & Dodge LLP

(57) ABSTRACT

A heat dissipation semiconductor package includes a chip carrier, a semiconductor chip, a heat conductive adhesive, a heat dissipation member, and an encapsulant. The semiconductor chip is flip-chip mounted on the chip carrier and defined with a heat conductive adhesive mounting area. Periphery of the heat adhesive mounting area is spaced apart from edge of the semiconductor chip. The heat dissipation member is mounted on the heat conductive adhesive formed in the heat conductive adhesive mounting area. The encapsulant formed between the chip carrier and the heat dissipation member encapsulates the semiconductor chip and the heat conductive adhesive, and embeds edges of the active surface and non-active surface and side edge of the semiconductor chip, thereby increasing bonding area between the encapsulant and the semiconductor chip. The side edges of the heat conductive adhesive and the semiconductor chip are not flush with each other, thereby preventing propagation of delamination.

11 Claims, 5 Drawing Sheets

HEAT DISSIPATION SEMICONDUCTOR PACKAGE

BACKGROUND OF THE INVENTION

1. Field of the Invention

The present invention generally relates to semiconductor packages, and more specifically, to a heat dissipation semiconductor package that integrates with a heat dissipation member.

2. Description of Related Art

To meet the demand for smaller, thinner, and lighter electronic products, semiconductor packages that reduce IC area and bear high-density and high-pin features, such as ball grid array (BGA), have become the mainstream in the market of semiconductor packages. This kind of semiconductor packages have relatively high density of electronic circuits and electronic components and therefore generate a relatively great amount of heat during operation. Besides, this kind of semiconductor packages use an encapsulant of low thermal conductivity to encapsulate semiconductor chips and therefore, more often than not, performance of the semiconductor chips are adversely affected due to inefficient heat dissipation.

In order to enhance heat dissipation of semiconductor packages, the semiconductor industry developed techniques of incorporating heat dissipation structures into the semiconductor packages, and related techniques were disclosed by U.S. Pat. Nos. 6,552,428, 6,400,014, 6,472,743, 5,977,626, 5,851,337, 6,236,568, 6,507,116, 5,672,548, 6,744,132, 6,403,882, and so on.

Please refer to FIG. 1, which is a cross-sectional view of a semiconductor package with an exposed heat spreader according to U.S. Pat. No. 6,552,428. As shown in the drawing, a heat spreader 12 is mounted on a substrate 10. The heat spreader 12 comprises a lower portion 123 with an opening 123a formed in the middle thereof, an upper portion 121, and connection parts 122 that connect periphery of the opening 123a of the lower portion 123 and edges of the upper portion 121, wherein the lower portion 123 has a plurality of supportive legs 123b at proper locations, through which the heat spreader 12 stands on the substrate 10 and the upper portion 121 of the heat spreader 12 is spaced apart from the substrate 10 by a predetermined distance. As a result, the top surface of the upper portion 121 is exposed from the encapsulant with a view to dissipating the heat generated by the chip 11 in operation.

However, in the aforementioned semiconductor package, heat generated by a chip in operation has to be dissipated by means of the encapsulant. The encapsulant is made of material of low thermal conductivity, with a low thermal conductivity coefficient of 0.8 w/m° K. Therefore, heat generated by a chip in operation is not effectively transmitted to the heat spreader but accumulates, thereby adversely affecting the performance and life of the chip.

Referring to FIG. 2, in view of the aforementioned drawbacks of the prior art, a heat dissipation semiconductor package with a heat dissipation structure 23 is disclosed by U.S. Pat. No. 5,977,626. The heat dissipation structure 23 comprises: a flat section 230, top of which is exposed from an encapsulant 24; a plurality of supportive sections 231 for supporting the flat section 230 above a semiconductor chip 21; and a plurality of contact sections 232, which extends from bottom of the supportive sections 231 and is attached to a plurality of protruding sections 237 of the substrate 20; wherein the supportive sections 231 are located around outer periphery of the flat section 230 and extend gradually outward and downward to the contact sections 232 to form a trough-shaped space 28 for receiving the semiconductor chip 21. In addition, a protruding section 234 extending downward from the flat section 230 of the heat dissipation structure 23 and contacting the semiconductor chip 21 is formed such that heat generated by the chip 21 in operation can be directly dissipated and transferred to the atmosphere via the protruding section 234 and the flat section 230 of the heat dissipation structure 23 rather than dissipated via the encapsulant 24 of low thermal conductivity.

However, in the encapsulation molding process of the aforementioned semiconductor package, in order to avoid overflow of the encapsulant, the inner top wall of the applied encapsulation mold must be in tight contact with and abuts against the flat section of the heat dissipation structure. If the inner top wall of the encapsulation mold abuts against the heat dissipation structure too forcefully, the chip below the heat dissipation structure may easily break for bearing excessively great pressure from the protruding section.

In order to circumvent the abovementioned problems, U.S. Pat. No. 6,403,882 discloses another heat dissipation semiconductor package. As shown in FIG. 3A, the heat dissipation semiconductor package comprises: a chip 31 having an active surface 36 and an opposing non-active surface 37, wherein the non-active surface 37 has a heat conductive adhesive 32 of low elastic modulus formed thereon, and the heat conductive adhesive 32 covers the non-active surface 37 of the chip 31 fully; a protective board 33 bonded to the non-active surface 37 of the chip 31 via the heat conductive adhesive 32; and a chip carrier 30 bonded to the active surface 36 of the chip 31. The heat conductive adhesive is intended to improve the thermal resistance of the chip.

Referring to FIG. 3B, an encapsulation molding process is performed so as to form encapsulant 34 encapsulating the chip. The heat conductive adhesive 32 covers the non-active surface 37 of the chip 31 fully. As a result, an interface formed between the encapsulant 34 encapsulating the chip 31 and the heat conductive adhesive 32 is limited to the side edge of the heat conductive adhesive 32. Accordingly, delamination D easily occurs to the interface due to expansion/contraction in a thermal cycle. Also, propagation of delamination easily occurs along the interface, thus leading to delamination between the chip 31 and the encapsulant 34. Furthermore, since the area of contact between the encapsulant 34 and the chip 31 is limited to the side edge of the chip 31, adhesive force is notably inadequate. Therefore, the delamination further propagates to the active surface 36 of the chip 31, thus leading to damage of the conductive bumps 35 for electrically connecting the chip 31 to the chip carrier 30.

In view of the above, it has become urgent to provide a technique which provides simple fabrication method for fabricating heat dissipation semiconductor package at low cost and effectively overcoming the drawbacks of the conventional semiconductor packages as mentioned above.

SUMMARY OF THE INVENTION

In view of the disadvantages of the prior art mentioned above, it is an objective of the present invention to provide a heat dissipation semiconductor package that is capable of preventing delamination from occurring to interface between encapsulant and heat conductive adhesive.

It is another objective of the present invention to provide a heat dissipation semiconductor package that is capable of avoiding propagation of delamination at interfaces between different components of the semiconductor package.

It is a further objective of the present invention to provide a heat dissipation semiconductor package that has low thermal resistance.

It is still another objective of the present invention to provide a heat dissipation semiconductor package that is capable of avoiding chip damage due to pressure in the encapsulation molding process.

To achieve the aforementioned and other objectives, a heat dissipation semiconductor package is provided according to the present invention. The heat dissipation semiconductor package comprises: a chip carrier; a semiconductor chip mounted on and electrically connected to the chip carrier, a heat conductive adhesive mounting area being defined on surface of the semiconductor chip and periphery of the heat conductive adhesive mounting area being spaced apart from edge of the semiconductor chip by an interval; a heat conductive adhesive formed in the heat conductive adhesive mounting area; a heat dissipation member mounted on the heat conductive adhesive; and an encapsulant formed between the chip carrier and the heat dissipation member for encapsulating the semiconductor chip and the heat conductive adhesive.

According to the present invention, since area of the heat conductive adhesive between the semiconductor chip and the heat dissipation member is less than area of the semiconductor chip, edges of the active surface and non-active surface and side edge of the semiconductor chip can be embedded in the encapsulant, thereby enhancing bonding area between the encapsulant and the chip and further avoiding problem of delamination. Also, because edges of the heat conductive adhesive and the chip are not flush with each other, propagation of delamination can be prevented.

In one embodiment, the semiconductor chip is flip-chip mounted on and electrically connected to the chip carrier, and the heat conductive adhesive mounting area is defined on the non-active surface of the semiconductor chip. Alternatively, the semiconductor chip can be electrically connected to the chip carrier by means of wire bonding, and the heat conductive adhesive mounting area is defined on the active surface of the semiconductor chip. Furthermore, the interval between periphery of the heat conductive adhesive mounting area and edge of the semiconductor chip falls in range of ⅓ to ⅕ of interval between the center and edge of the semiconductor chip, and preferably the interval between periphery of the heat conductive adhesive mounting area and edge of the semiconductor chip is ¼ of the interval between center and edge of the semiconductor chip.

According to the present invention, a heat conductive adhesive mounting area is defined on surface of a semiconductor chip and periphery of the heat conductive adhesive mounting area is spaced apart from edge of the semiconductor chip by an interval. Thus, a heat dissipation member can be mounted on the semiconductor chip via a heat conductive adhesive formed in the heat conductive adhesive mounting area so as to provide the semiconductor chip with a heat conductive path of low thermal resistance. The area occupied by the heat conductive adhesive formed on the heat conductive adhesive mounting area is less than the area of the semiconductor chip, and thus edges of the active surface and the non-active surface and side edge of the semiconductor chip can be embedded in the encapsulant, thereby enhancing bonding area between the encapsulant and the chip and preventing delamination from occurring. Moreover, as edges of the heat conductive adhesive and the semiconductor chip are not flush with each other, propagation of delamination can be prevented. In addition, during the encapsulation molding process, pressure from the encapsulation mold can be absorbed through deformation of the heat conductive adhesive with an elastic characteristic, thereby protecting the semiconductor chip from being damaged by pressure.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 4A through 4E are schematic views of a heat dissipation semiconductor package according to a first embodiment of the present invention.

Figure 1:
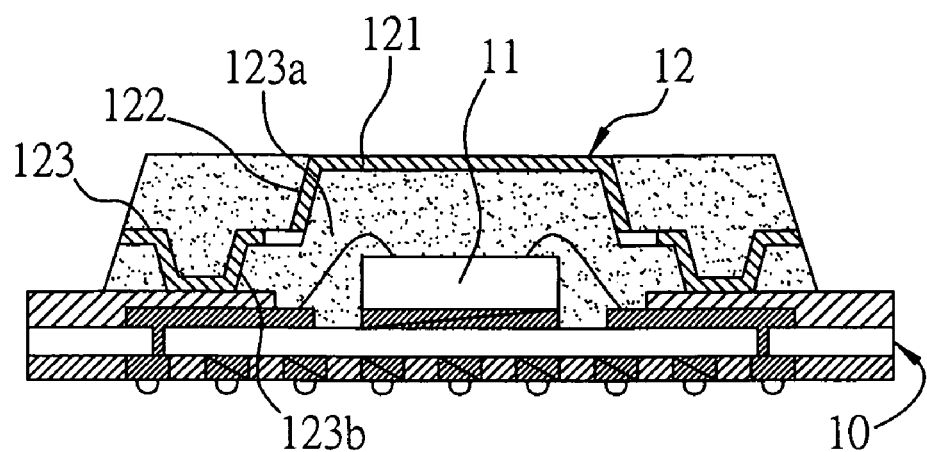
FIG. 1 is a cross-sectional view of a heat dissipation semiconductor package according to U.S. Pat. No. 6,552,428.
Figure 2:
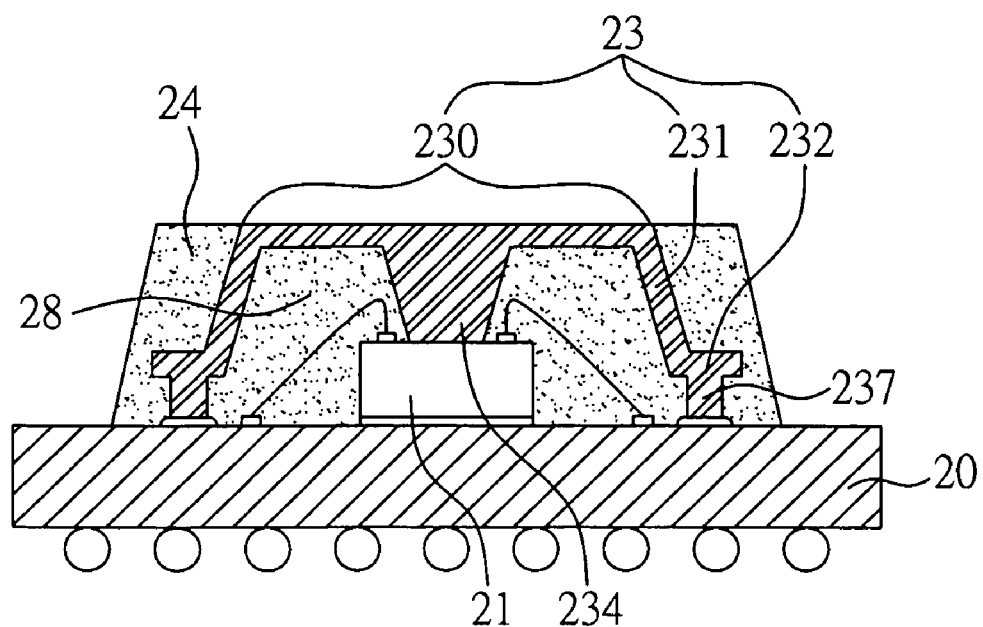
FIG. 2 is a cross-sectional view of a heat dissipation semiconductor package according to U.S. Pat. No. 5,977,626.
Figure 3A:
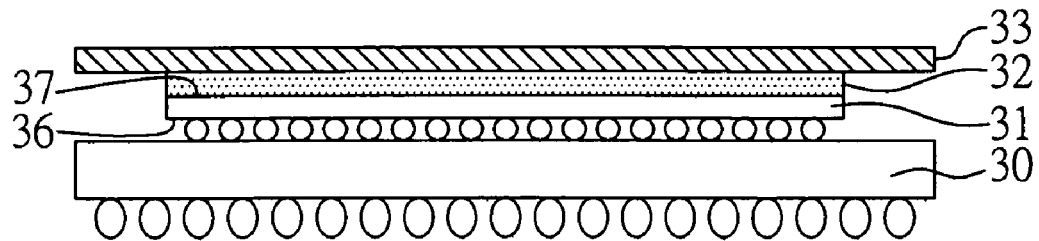
FIG. 3A is a cross-sectional view of a heat dissipation semiconductor package according to U.S. Pat. No. 6,403,882.
Figure 3B:
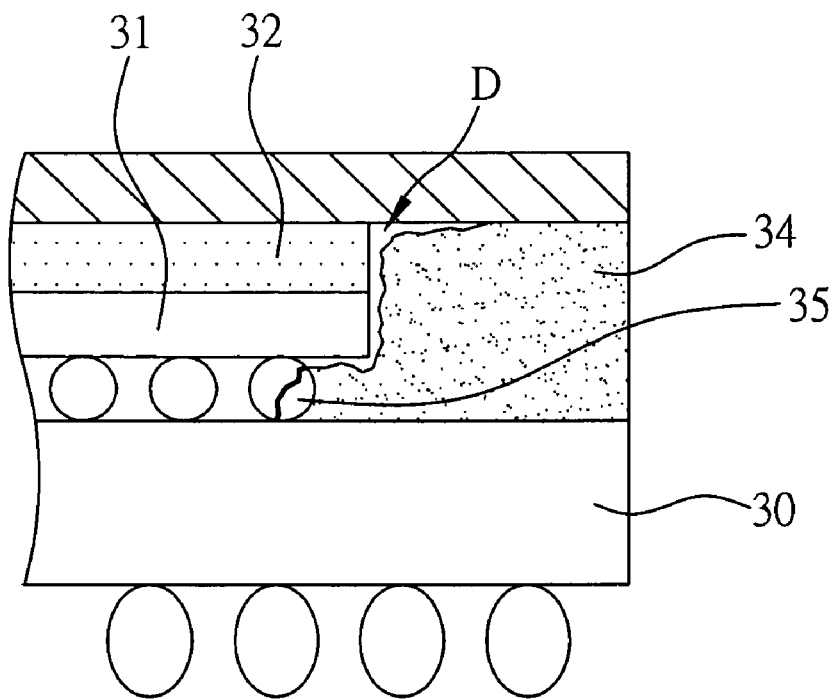
FIG. 3B is a cross-sectional view that illustrates delamination of the heat dissipation semiconductor package disclosed by U.S. Pat. No. 6,403,882.
Figure 4A:
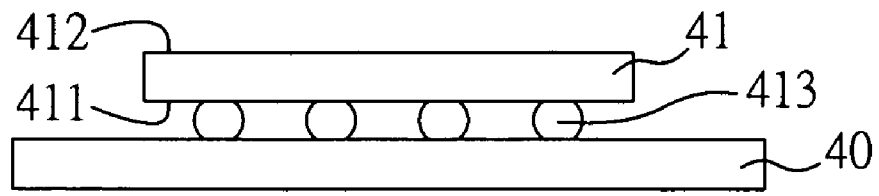
FIGS. 4A through 4E are schematic views of a heat dissipation semiconductor package according to a first embodiment of the present invention.

Referring to FIG. 4A, a chip carrier 40 and a semiconductor chip 41 that has an active surface 411 and an opposing non-active surface 412 are provided.

Figure 4B:
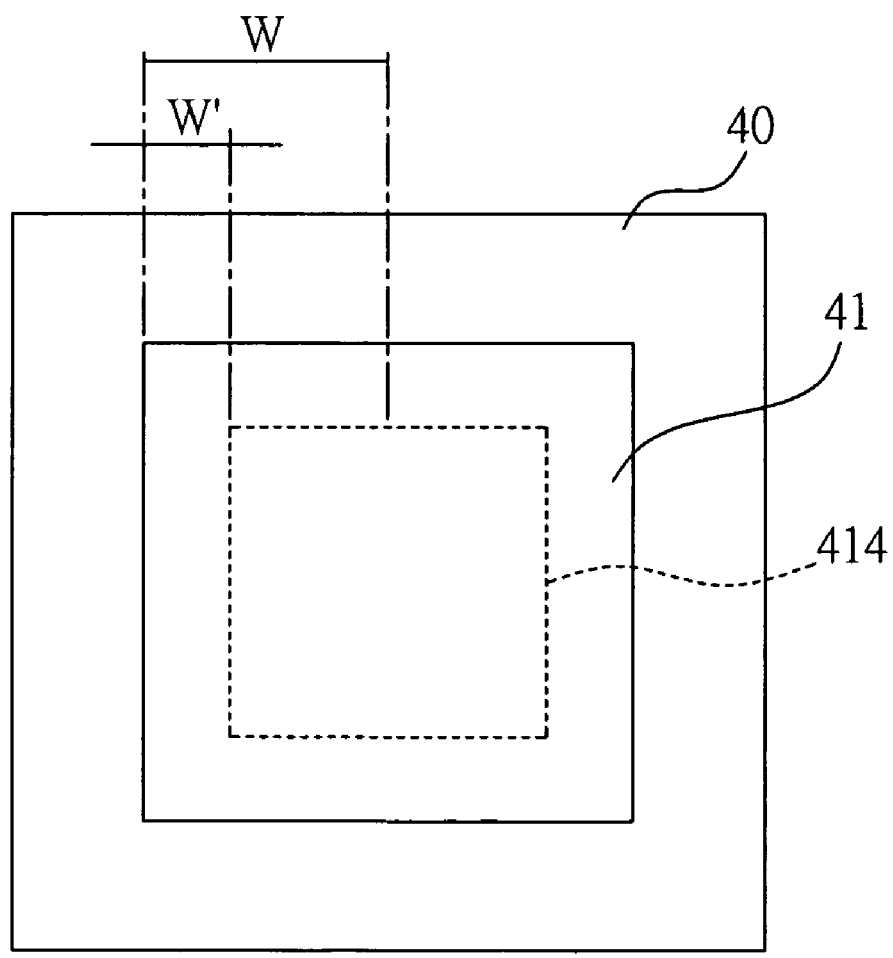

Referring to FIGS. 4A and 4B, a heat conductive adhesive mounting area 414 is defined in the non-active surface 412 of the semiconductor chip 41. The semiconductor chip 41 is flip-chip mounted on and electrically connected to the chip carrier 40 via the active surface 411 of the semiconductor chip 41.

The semiconductor chip 41 is electrically connected to the chip carrier 40 via a plurality of conductive bumps 413 on the active surface 411 of the semiconductor chip 41. The chip carrier 40 can be a substrate or a lead frame. Periphery of the heat conductive adhesive mounting area 414 is spaced apart from edge of the semiconductor chip 41 by an interval. In other words, the interval W' between periphery of the heat conductive adhesive mounting area 414 and edge of the semiconductor chip 41 falls in a range of ⅓ to ⅕ of interval W between the center and edge of the semiconductor chip 41. Preferably, the interval W' between periphery of the heat conductive adhesive mounting area 414 and edge of the semiconductor chip 41 is ¼ of the interval W between the center and edge of the semiconductor chip 41.

Figure 4C:
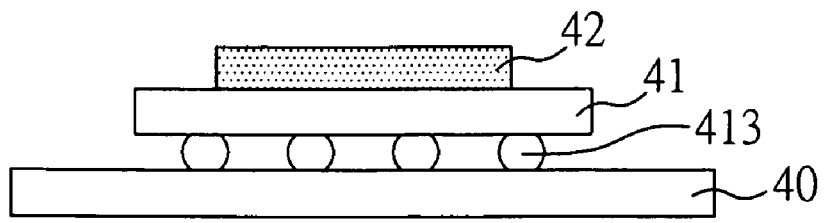

As shown in FIG. 4C, a heat conductive adhesive 42 is formed on the heat conductive adhesive mounting area 414 defined on the non-active surface 412 of the semiconductor chip 41. The heat conductive adhesive 42 is made of an epoxy with a relatively low elastic modulus below 1000 Mpa. The glass transition temperature (Tg) of the heat conductive adhesive 42 is lower than 25° C. The heat conductive adhesive 42 comprises a heat conductive material such that the thermal conductivity coefficient of the heat conductive adhesive 42 fall in a range of 2 to 5 w/m° K.

Figure 4D:
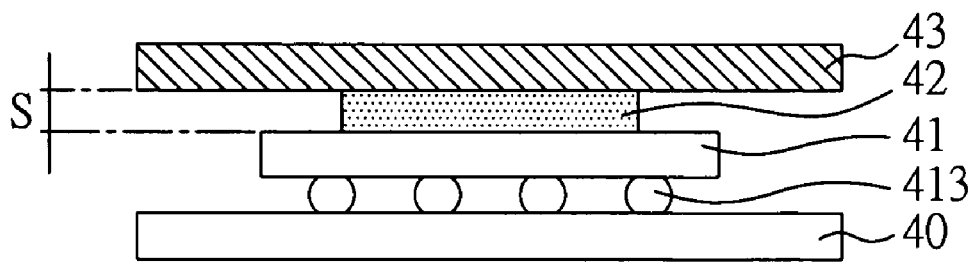
Figure 4E:
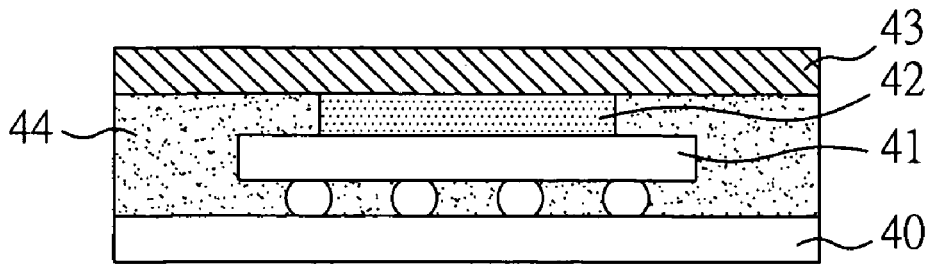

As shown in FIGS. 4D and 4E, a heat dissipation member 43 is mounted on the heat conductive adhesive 42 for dissipating heat generated by the semiconductor chip 41 during operation. Then, an encapsulation molding process is performed so as to form an encapsulant 44 between the chip carrier 40 and the heat dissipation member 43 to encapsulate the semiconductor chip 41 and the heat conductive adhesive 42, thus completely isolating the semiconductor chip 41 from outside. Therein, thickness S of the heat conductive adhesive 42 falls in range of 50 to 300 μm, preferably 200 μm. In addition, during the encapsulation molding process, pressure from the encapsulation mold can be absorbed through deformation of the heat conductive adhesive 42 with an elastic characteristic, thereby protecting the semiconductor chip 41 from being damaged by pressure.

The area of the heat conductive adhesive 42 between the semiconductor chip 41 and the heat dissipation member 43 is less than that of the semiconductor chip 41. Hence, edges of the active surface and non-active surface and side edge of the semiconductor chip 41 can be embedded in the encapsulant 44, thereby enhancing the bonding area between the encapsulant 44 and the chip 41 and preventing problem of delamination from occurring. Moreover, as side edges of the heat conductive adhesive 42 and the semiconductor chip 41 are not flush with each other, propagation of the delamination is prevented.

Figure 5:
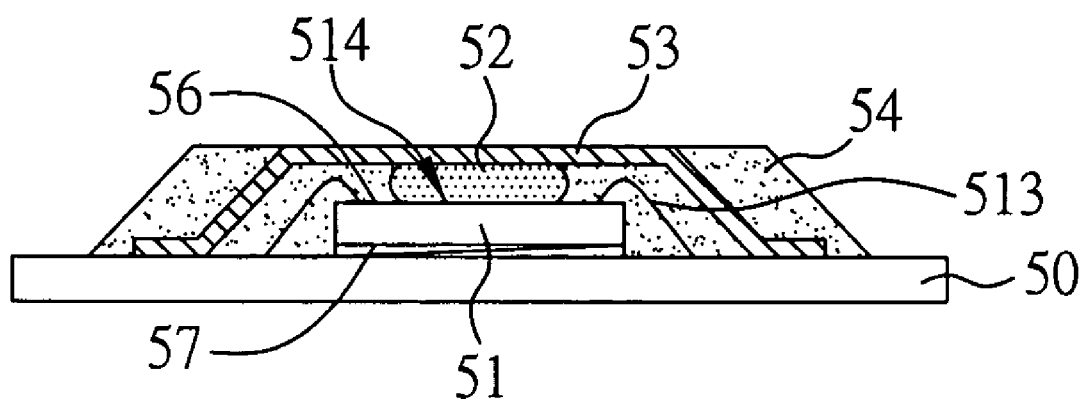
FIG. 5 is a cross-sectional view of a heat dissipation semiconductor package according to a second embodiment of the present invention.

FIG. 5 is a cross-sectional view of a heat dissipation semiconductor package according to a second embodiment of the present invention.

The heat dissipation semiconductor package of the present embodiment is mostly similar to that of the first embodiment, with a main difference therebetween as follows. Referring to FIG. 5, a semiconductor chip 51 is mounted on a chip carrier 50 via a non-active surface 57 of the semiconductor chip 51 and is electrically connected to the chip carrier 50 by means of wire bonding via a plurality of bonding wires 513. Also, a heat conductive adhesive mounting area 514 is defined on an active surface 56 of the semiconductor chip 51 at a position without affecting the bonding wires 513. Periphery of the heat conductive adhesive mounting area 514 is spaced apart from edge of the semiconductor chip 51 by an interval. Thus, a heat dissipation member 53 can be mounted on the active surface 56 of the semiconductor chip 51 via a heat conductive adhesive 52 formed in the heat conductive adhesive mounting area 514. Thereafter, an encapsulant 54 can be formed to encapsulate the semiconductor chip 51 and the heat conductive adhesive 52, and the top surface of the heat dissipation member 53 is exposed from the encapsulant 54.

According to the present invention, a heat conductive adhesive mounting area is defined on surface of a semiconductor chip and periphery of the heat conductive adhesive mounting area is spaced apart from edge of the semiconductor chip by an interval. Thus, a heat dissipation member can be mounted on the semiconductor chip via a heat conductive adhesive formed on the heat conductive adhesive mounting area so as to provide the semiconductor chip with a heat conduction path of low thermal resistance. Since the area occupied by the heat conductive adhesive formed on the heat conductive adhesive mounting area is less than the area of the semiconductor chip, edges of the active surface and the non-active surface and side edge of the semiconductor chip can be embedded in the encapsulant, thereby enhancing bonding area between the encapsulant and the chip and preventing delamination from occurring. Moreover, as edges of the heat conductive adhesive and the semiconductor chip are not flush with each other, propagation of delamination is prevented. In addition, during the encapsulation molding process, pressure from the encapsulation mold can be absorbed through deformation of the heat conductive adhesive with an elastic characteristic, thereby protecting the semiconductor chip from being damaged by pressure.

The foregoing descriptions of the detailed embodiments are only illustrated to disclose the features and functions of the present invention and not restrictive of the scope of the present invention. It should be apparent to those in the art that all modifications and variations made according to the spirit and principle in the disclosure of the present invention should fall within the scope of the appended claims.

What is claimed is:

1. A heat dissipation semiconductor package, comprising:
    a chip carrier;
    a semiconductor chip mounted on and electrically connected to the chip carrier, with a surface of the semiconductor chip being defined with a heat conductive adhesive mounting area, wherein a periphery of the heat conductive adhesive mounting area is spaced apart from an edge of the semiconductor chip by an interval;
    a heat conductive adhesive formed in the heat conductive adhesive mounting area;
    a heat dissipation member mounted on the heat conductive adhesive; and
    an encapsulant formed between the chip carrier and the heat dissipation member and formed between the semiconductor chip and the heat dissipation member, and encapsulating the semiconductor chip and the heat conductive adhesive,
    wherein the interval between the periphery of the heat conductive adhesive mounting area and the edge of the semiconductor chip falls in a range of ⅓ to ⅕ of an interval between a center and the edge of the semiconductor chip.

2. The heat dissipation semiconductor package of claim 1, wherein the chip carrier is one of a substrate and a lead frame.

3. The heat dissipation semiconductor package of claim 1, wherein the semiconductor chip has an active surface and an opposing non-active surface defined with the heat conductive adhesive mounting area, and is flip-chip mounted on and electrically connected to the chip carrier via the active surface of the semiconductor chip.

4. The heat dissipation semiconductor package of claim 1, wherein the semiconductor chip has an active surface defined with the heat conductive adhesive mounting area and an opposing non-active surface, the semiconductor chip is mounted on the chip carrier via the non-active surface of the semiconductor chip and electrically connected to the chip carrier by wire bonding.

5. The heat dissipation semiconductor package of claim 1, wherein the interval between the periphery of the heat conductive adhesive mounting area and the edge of the semiconductor chip is ¼ of the interval between the center and the edge of the semiconductor chip.

6. The heat dissipation semiconductor package of claim 1, wherein the heat conductive adhesive is made of epoxy of low elastic modulus.

7. The heat dissipation semiconductor package of claim 1, wherein the elastic modulus of the heat conductive adhesive is less than 1000 Mpa.

8. The heat dissipation semiconductor package of claim 1, wherein the glass transition temperature (Tg) of the heat conductive adhesive is lower than 25° C.

9. The heat dissipation semiconductor package of claim 1, wherein the heat conductive adhesive comprises a heat conductive material such that thermal conductivity coefficient of the heat conductive adhesive falls in a range of 2 to 5 w/m° K.

10. The heat dissipation semiconductor package of claim 1, wherein the semiconductor chip has an active surface and an opposing non-active surface, and edges of the active surface and non-active surface and side edge of the semiconductor chip are embedded in the encapsulant, thereby increasing bonding area of the semiconductor chip and the encapsulant.

11. The heat dissipation semiconductor package of claim 1, wherein edges of the heat conductive adhesive and the semiconductor chip are not flush with each other, thereby preventing propagation of delamination between different materials of the semiconductor package.

* * * * *